United States Patent
Liu et al.

(10) Patent No.: US 7,611,960 B2
(45) Date of Patent: Nov. 3, 2009

(54) METHOD AND SYSTEM FOR WAFER BACKSIDE ALIGNMENT

(75) Inventors: Sheng-Chieh Liu, Taichung (TW); Chia-Hung Kao, Hsin-Chu (TW); Tzu-Yang Wu, Hsin-Chu (TW); Sheng-Liang Pan, Hsin-Chu (TW); Yuan-Bang Lee, Miaoli County (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 244 days.

(21) Appl. No.: 11/409,582

(22) Filed: Apr. 24, 2006

(65) Prior Publication Data

US 2007/0249137 A1 Oct. 25, 2007

(51) Int. Cl.
*H01L 21/76* (2006.01)
*H01L 21/302* (2006.01)
*H01L 21/461* (2006.01)

(52) U.S. Cl. .................................... 438/401; 438/689

(58) Field of Classification Search ................ 438/401, 438/689, 737, 33, 42, 45; 29/594, 25.41, 29/25.42; 257/E23.179, E23.098, E21.174, 257/E21.485, E21.24, E21.49, E21.245
See application file for complete search history.

(56) References Cited

U.S. PATENT DOCUMENTS

| | | | |
|---|---|---|---|
| 5,757,507 A | 5/1998 | Ausschnitt et al. | |
| 5,834,334 A | 11/1998 | Leedy | |
| 5,929,997 A | 7/1999 | Lin | |
| 6,380,554 B1 | 4/2002 | Bush et al. | |
| 6,383,827 B1 | 5/2002 | Lukanc et al. | |
| 6,393,714 B1 | 5/2002 | Look et al. | |
| 6,423,555 B1 | 7/2002 | Babcock | |
| 6,525,805 B2 | 2/2003 | Heinle | |
| 6,716,559 B2 | 4/2004 | Leidy et al. | |
| 6,829,814 B1* | 12/2004 | Freeman et al. | ............... 29/594 |
| 6,844,244 B2 | 1/2005 | Best et al. | |
| 6,861,186 B1* | 3/2005 | Pagette et al. | ................. 430/22 |
| 6,921,916 B2 | 7/2005 | Adel et al. | |
| 6,952,886 B1 | 10/2005 | Kim | |
| 6,967,709 B2 | 11/2005 | Mellinger et al. | |
| 7,084,427 B2 | 8/2006 | Argandona et al. | |
| 7,095,483 B2* | 8/2006 | Daniel et al. | ................. 355/53 |
| 7,099,011 B2 | 8/2006 | McArthur et al. | |
| 7,251,018 B2* | 7/2007 | Van Buel | ..................... 355/55 |
| 2002/0140917 A1 | 10/2002 | McArthur et al. | |
| 2002/0167649 A1 | 11/2002 | Heinle | |
| 2004/0051127 A1 | 3/2004 | Tanaka | |

(Continued)

OTHER PUBLICATIONS

Zieijl, H.W., et al., "Backwafer Optical Lithography and Wafer Distortion in Substrate Transfer Technologies" Proceedings of SPIE, vol. 4181, Aug. 2000, pp. 200-207, The Netherlands.

(Continued)

*Primary Examiner*—Walter L Lindsay, Jr.
(74) *Attorney, Agent, or Firm*—Haynes and Boone, LLP

(57) ABSTRACT

Disclosed is a method and a system for wafer backside alignment. A zero mark patterning on front side of a substrate. A plurality of layers are deposited on the front side of the substrate. The wafer is flipped over with backside of the substrate facing up, and a through wafer etching is performed from the backside to an etch stop layer deposited over the front side of the substrate.

18 Claims, 6 Drawing Sheets

U.S. PATENT DOCUMENTS

2005/0078289 A1     4/2005    Daniel et al.
2006/0249859 A1    11/2006    Eiles et al.
2007/0072091 A1     3/2007    Smith et al.
2007/0216041 A1     9/2007    Patti et al.
2007/0249137 A1    10/2007    Liu et al.

OTHER PUBLICATIONS

Zieijl, H.W. et al. "Front-to-Backwafer Alignment, Overlay and Wafer Distortion in Substrate Transfer Technologies," Proceedings of the SAFE/IEEE Workshop. Nov. 29-30, 2000, pp. 163-167, The Netherlands.

Zieijl, H.W., et al. "Characterization of Front-to-Backwafer Bulk Micromachining Using Electrical Overlay Test Structures," Proceedings of the SAFE/IEEE Workshop, Jun. 13, 2003, pp. 108-112, IOP Publishing Ltd., The Netherlands.

Taiwan Office Action issued Mar. 13, 1998, Application No. 095132490.

* cited by examiner

| Item | 8.0 to 8.8 error [um] | | | | Signal strength | |
|---|---|---|---|---|---|---|
| | X_M1 | Y_M1 | X_M2 | Y_M2 | M1 [%] | M2 [%] |
| Spec. | <0.25 | <0.25 | <0.25 | <0.25 | >1 | >1 |
| Result | -0.027 | -0.004 | -0.055 | -0.060 | 11 | 6 |

Figure 5

METHOD AND SYSTEM FOR WAFER BACKSIDE ALIGNMENT

BACKGROUND

The present disclosure relates in general to fabrication of micro-electro mechanical systems (MEMS) devices, and more particularly, to wafer backside alignment in fabrication of MEMS devices. The present disclosure also relates to an improved method and system for wafer backside alignment in fabrication of MEMS devices.

MEMS devices are common in applications, including wafer leveling packaging, integrated optics, pressure sensors, compound devices, and backside vias. In fabrication of three-dimensional devices such as MEMS, the substrate is processed on one side, flipped over, and is processed on the opposite side to create a desired three-dimensional structure. Front side and backside alignment are performed to ensure that the three-dimensional structure is properly aligned. For example, if a contact runs through the substrate from the front side to the backside, it must be precisely aligned to other elements of the device, such that electrical contacts can be made.

Currently, a number of methods are used to align the backside substrate from the front side, including blind stepping, double-side aligner, and backside alignment with embedded optics. Blind stepping is only suitable for low end products, and does not provide alignment of successive patterns on the front side. In addition, the reliability of blind stepping is low. Double-side aligner involves automatic alignment of the front side by detecting the front side alignment mark, but the wafer backside position is captured manually with a microscope. Thus, double-side aligner is a semi-automatic process that requires manual handling and software adjustment. The reliability of the process also depends on the handling skill. In addition, the overlay shift of a double-side aligner is around 2 µm, which indicates a low overlay accuracy.

Backside alignment with embedded optics involves the use of prisms to reflect the front side alignment mark when the wafer backside faces up. This requires addition of embedded optics by the step and scan tool. However, this method is complex in that the alignment laser must pass through a complex route. In addition, the signal strength of the alignment light is a weak point of the alignment system design. Furthermore, the overlay shift of backside alignment with embedded optics is around 0.18 µm.

Therefore, a need exists for an improved method and system for wafer backside alignment that is simple and robust, provides a quick measurement of various alignment sites on a substrate such that it can be quickly aligned and processed, and provides a satisfactory overlay accuracy.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 5 is a table illustrating results of a photo alignment.

DETAILED DESCRIPTION

Figure 1:
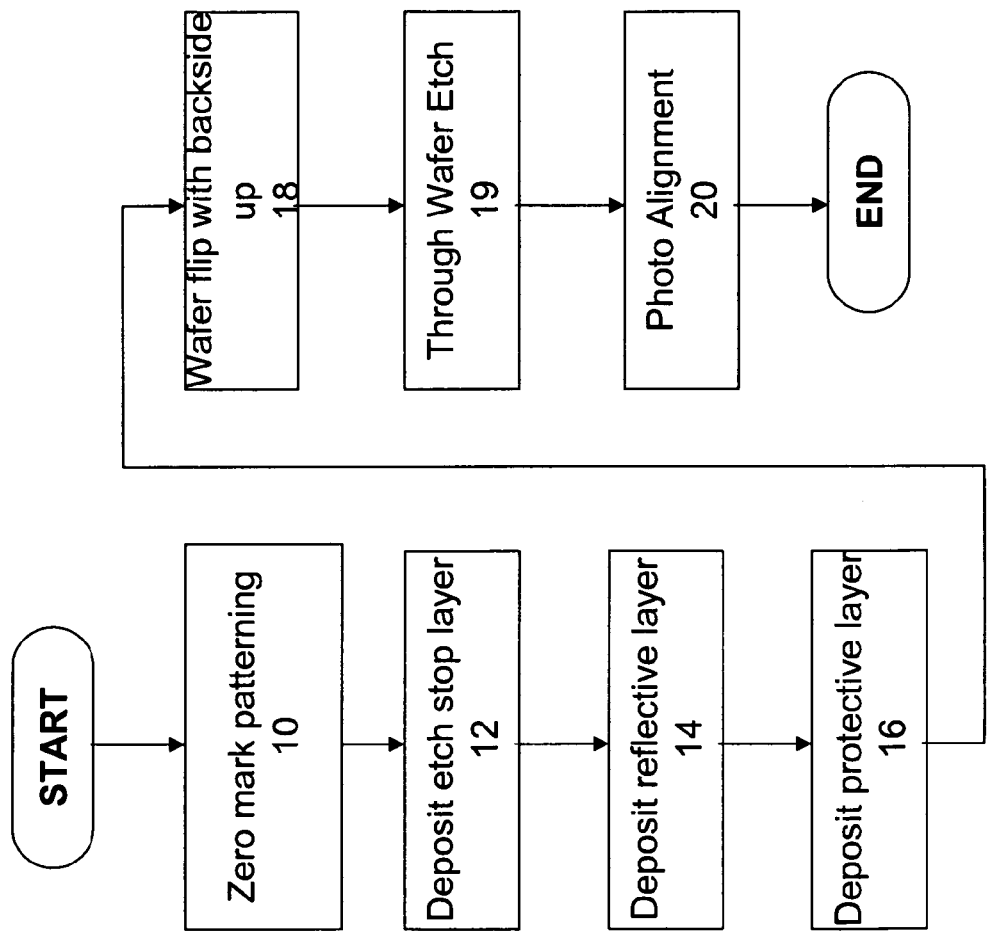
FIG. 1 is a flowchart of an exemplary process for wafer backside alignment.

For the purposes of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, and this does not by itself indicate a requirement that features of one embodiment apply to another embodiment, even if they share the same reference number.

Aspects of the present disclosure provide a method and a system for wafer backside alignment. In an illustrative embodiment, a two step process is performed including a wafer front side alignment process and a backside through wafer etching process. Referring to FIG. 1, a flowchart of an exemplary process for wafer backside alignment is depicted. The process begins at step 10, where zero mark patterning is performed to form a pattern on the front side of the substrate. At step 12, an etch stop layer is deposited over the front side substrate. At step 14, a reflective layer is deposited over the etch stop layer, and at step 16, a protective layer is optionally deposited over the reflective layer. After the front side alignment process is completed in steps 10-14, the wafer is flipped over with the backside facing up at step 18. A through wafer etching is performed at step 19 to etch through the substrate from the backside. At step 20, a backside photo alignment is performed to align the backside with the front side.

Figure 2:
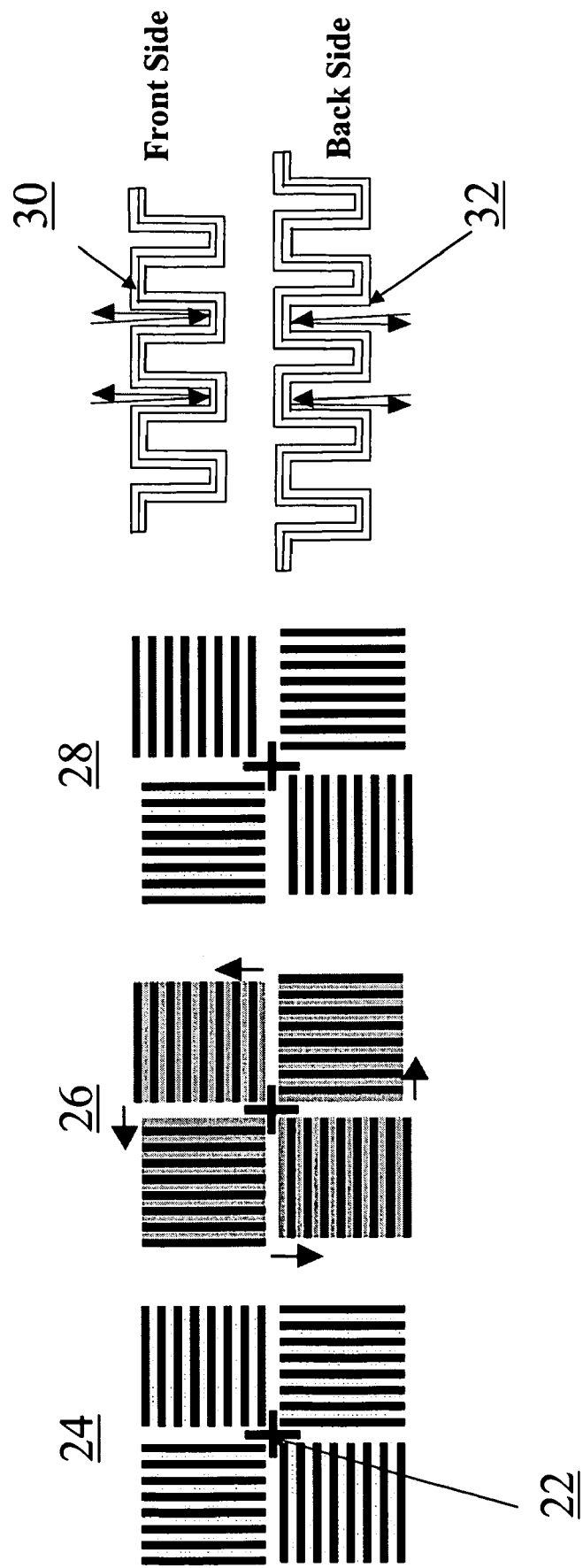
FIG. 2 is a diagram illustrating zero mark patterning.

Referring to FIG. 2, a diagram illustrating zero mark patterning is depicted. The generic zero mark 22 is used to form a pattern 24 for the wafer backside alignment. In this example, the zero mark pattern is shifted counterclockwise, as shown in pattern 26. The shifted pattern 28 fits the original alignment signal reflective condition when the wafer is flipped to the backside. In this way, the reflective status of the alignment marks on the front side 30 is the same as the alignment marks on the backside 32. Thus, wafer alignment may now be performed from the backside instead of the front side with the same alignment marks.

Figure 3:
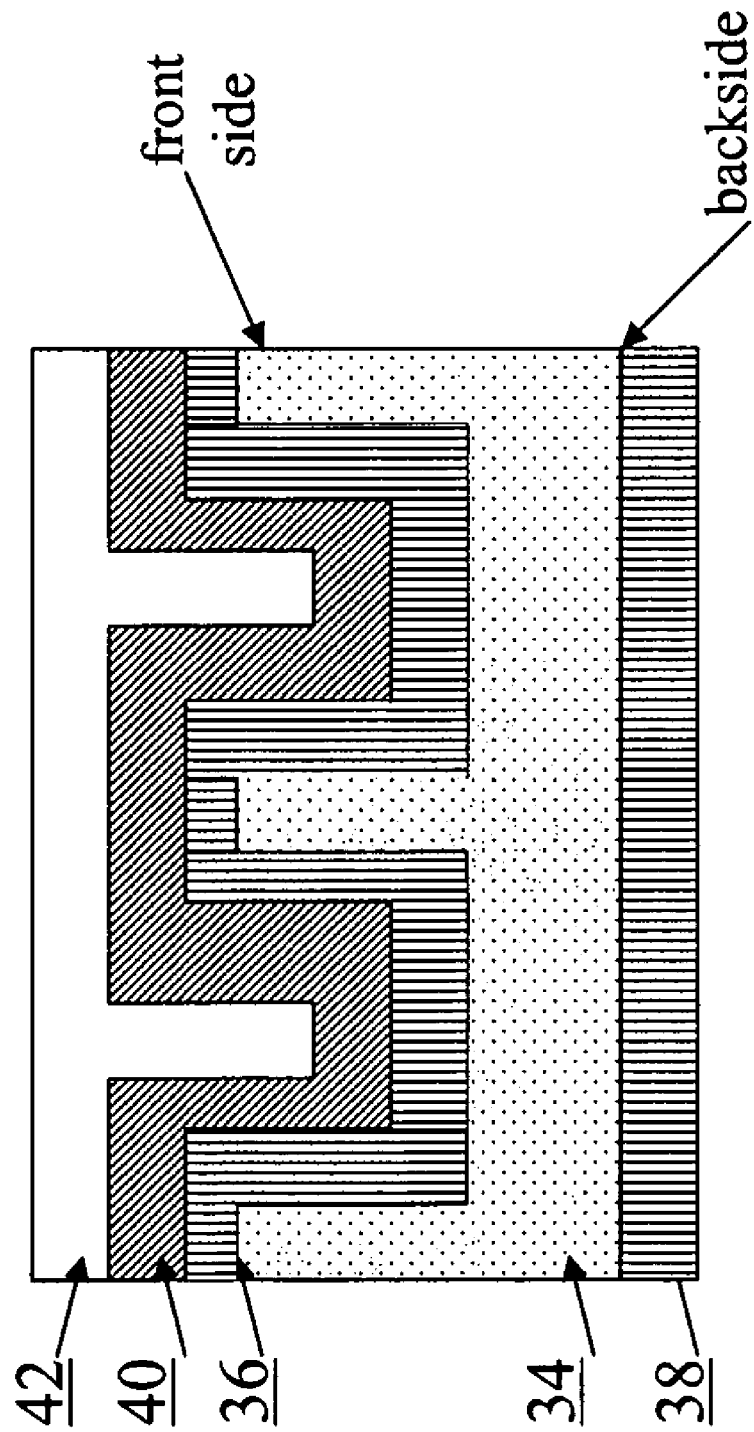
FIG. 3 is a diagram illustrating the deposition of layers on the substrate.

Referring to FIG. 3, a diagram illustrating the deposition of layers on the substrate is depicted. On the front side of substrate 34, an oxide layer 36 is deposited over substrate 34 to act as an etch stop layer when through wafer etching is later performed from the backside. The substrate 34 may comprise polysilicon or other silicon material and the thickness of the substrate 34 is preferably around 650 um. The etch stop layer 36 may be an oxidation film or a thermal oxide with a preferred thickness of 5 KA if the through wafer etch is a deep reactive ion etch (DRIE).

In addition to the front side, an etch stop layer is deposited on the backside of substrate 34 to form a backside hard mask 38 for through wafer etching. The backside hard mask 38 prevents etching damage to the substrate 34 when through wafer etching is later performed. The thickness of the backside hard mask 38 is preferably around 5 KA. The backside hard mask 38 is necessary for a higher photoresist etch rate and to add thickness to the structure. In an illustrative embodiment, the etch stop layer 36 and the backside hard mask 38 may be deposited using common oxidation techniques.

After the etch stop layer 36 is deposited and backside hard mask 38 is formed, a reflective layer 40 is deposited over the etch stop layer 36 on the front side of substrate 34. The reflective layer 40 may be deposited using common sputtering techniques and the thickness of the reflective layer 40 is preferably around 8 KA. The reflective layer 40 is necessary to reflect the alignment signal or laser back to the alignment system during backside alignment. The reflective layer 40 may comprise reflective material, such as WSi, POLY and WSi, and AlSiCu and ARC.

Once the reflective layer 40 is deposited, a protective layer 42 may be optionally deposited over the reflective layer 40 on the front side of substrate 34. The protective layer 42 may comprise materials such as A-Si or a passivation film, and may be deposited using physical vapor deposition (PVD). The thickness of the protective layer 42 is preferably around 40 KA. The protective layer 42 protects the front side from scratches during wafer transfer or vacuum bake, since the front side will be faced down when the wafer is flipped over and the front side may contact parts of the machine. In addition, the protective layer 42 strengthens the alignment marks and the front side structure in case the photoresist is not thick enough. After the layers are deposited, the front side processing is complete and the wafer is flipped over with the backside facing up.

The backside process then begins with a through wafer etching. In an illustrative embodiment, through wafer etching includes first using a photo clear-out mask to expose a backside square pattern that is opposite to the front side zero mark. An oxide etcher is then used to break through the backside hard mask 38. A through wafer bulk etch is performed to etch through the wafer substrate. In one embodiment, the through wafer bulk etch may be performed using a deep reactive ion etch (DRIE) silicon etcher.

Figure 4:
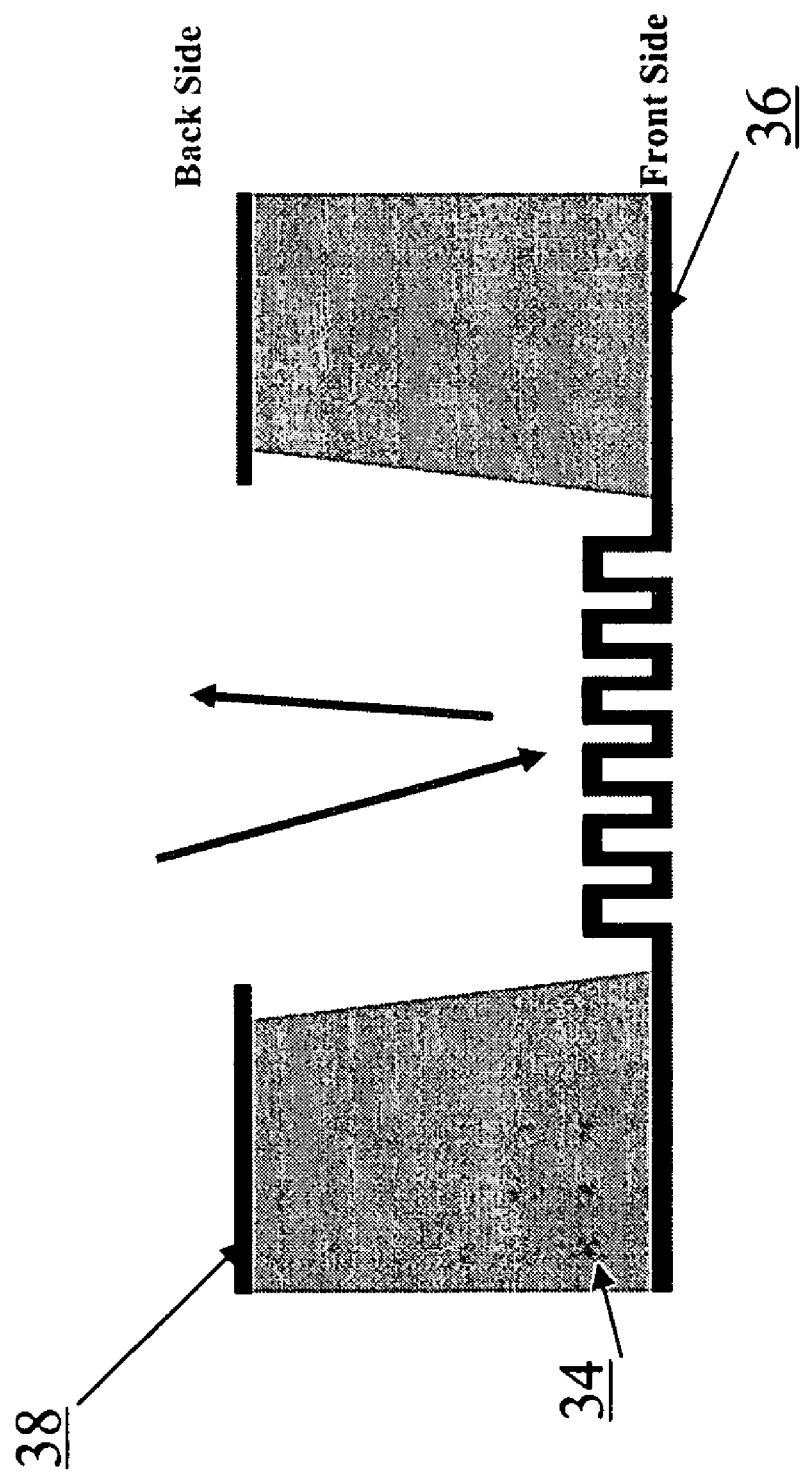
FIG. 4 is a diagram illustrating through wafer etch.

Referring to FIG. 4, a diagram illustrating through wafer etch is depicted. In this example, the through wafer etcher process uses a deep reactive ion etch (DRIE) silicon etcher to etch through silicon substrate 34 from the backside mask 38 to the front side stop layer 36. The DRIE etcher has a high etching selectivity between the silicon and the oxide film. In one example, the etching rate is around 12 um per minute and 650 um silicon substrate is etched away. For higher oxide selectivity concern, the remaining silicon substrate may be etched away by an over etching step, which has an over etching rate of 5 um per min.

Once the through wafer etching is complete, the photoresist is stripped and a photo alignment is performed to align the backside with the front side of the substrate. During photo alignment, alignment marks are captured by the alignment laser and positions can be calculated in the final alignment. Referring now to FIG. 5, a table illustrating results of a photo alignment is depicted. In this example, the shifting of X-axis and Y-axis of the marks M1 and M2 meet the acceptable specification and the signal strengths of both mark M1 and M2 are significantly above the signal strength required in the specification. The overlay shift is lower than 0.1 um, which is lower than the overlay shift of blind stepping and double-side aligner.

Figure 6:
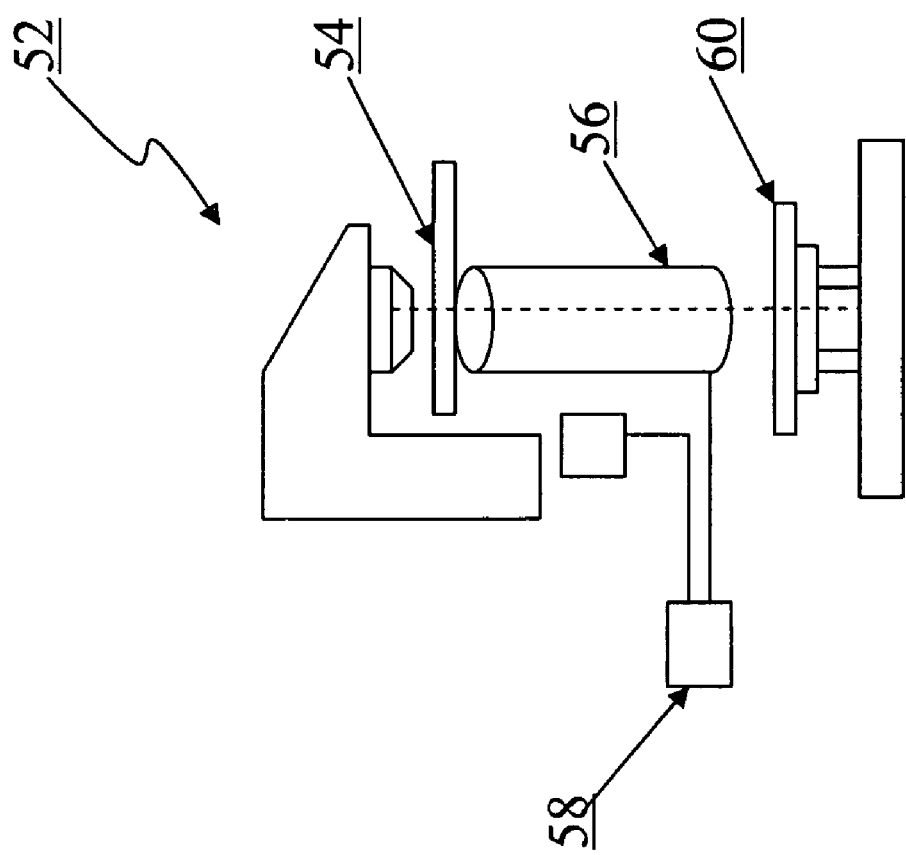
FIG. 6 is a diagram illustrating a system for wafer backside alignment.

Referring to FIG. 6, a diagram illustrating a system for photo alignment is depicted. Aspects of the present disclosure may be implemented within a photo alignment system 52, which in this example comprises a reticle 54, a projection lens 56, an alignment laser source 58, and a wafer stage 60. Once the front side and backside processes are performed according to steps described above, the backside of the wafer may be aligned with the front side of the wafer using an alignment system, such as an alignment system 52.

In summary, aspects of the present disclosure provides an improved method and system for through wafer backside alignment. The same zero mark for wafer front side and backside alignment is suitable for the original stepping process and the process performance may improve as a result of hardware upgrade. In addition, unlike the backside alignment with embedded optics, no embedded equipment is necessary. As indicated in the results, the overlay accuracy is improved. Furthermore, the process windows for current products are wider due to the better alignment. With the ability to accurately align the backside to the front side, the original forbidden area may be kept without using additional wafer area, which increases wafer yields.

It is to be understood that the following disclosure provides different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed.

What is claimed is:

1. A method of performing backside alignment of a wafer, the method comprising:
    performing zero mark patterning on front side of a substrate;
    depositing a plurality of layers on the front side of the substrate, wherein the depositing a plurality of layers includes:
        depositing an etch stop layer over the zero mark patterning; and
        depositing a reflective layer over the etch stop layer, wherein the reflective layer includes a pattern defined by the zero mark patterning; and
    flipping the wafer over with backside of the substrate facing up; and
    etching through the substrate from the backside of the substrate to expose the zero mark patterning.

2. The method of claim 1, wherein performing zero mark patterning on front side of a substrate comprises:
    shifting a zero mark to form a shifted pattern to fit alignment signal reflective condition when the wafer is flipped over to the backside.

3. The method of claim 1, further comprising:
    depositing an etch stop over the backside of the substrate to form a backside hard mask.

4. The method of claim 1, wherein depositing a plurality of layers on the front side of the substrate further comprises:
    depositing a protective layer over the reflective layer.

5. A method of performing backside alignment of a wafer, the method comprising:
    performing zero mark patterning on front side of a substrate;
    depositing a plurality of layers on the front side of the substrate, wherein depositing a plurality of layers on the front side of the substrate comprises;

depositing an etch stop layer over the front side of the substrate;

depositing an etch stop over the backside of the substrate to form a backside hard mask; and depositing a reflective layer over the etch stop layer on the front side of the substrate;

flipping the wafer over with backside of the substrate facing up; and performing a through wafer etch of the substrate; wherein performing a through wafer etch of the substrate comprises:

exposing a backside pattern opposite to a zero mark of the front side using a photo clear-out mask;

etching away the backside hard mask using an oxide etcher; and etching the substrate from the backside to the etch stop layer over the front side of the substrate using a deep reactive ion etch silicon etcher.

6. The method of claim 1, further comprising:

performing a photo alignment to align the backside of the substrate, wherein the photo alignment is performed using the zero mark pattern on the front side of the substrate.

7. The method of claim 3, wherein the etch stop layer and the backside hard mask comprise an oxidation film or a thermal oxide.

8. The method of claim 3, wherein the reflective layer comprises reflective material, and wherein the reflective material comprises at least one of AlSiCu, WSi, POLY+WSi, and AlSiCu+ARC.

9. The method of claim 4, wherein the protective layer protects the front side when the wafer is flipped over and strengthens structure of the front side of the substrate.

10. The method of claim 1, wherein the zero mark pattern on the front side of a wafer is operable to be used both for backside and front side alignment of the wafer.

11. The method of claim 1, wherein the performing zero mark patterning on front side of a substrate includes etching a pattern in the semiconductor substrate.

12. The method of claim 1, wherein depositing an etch stop layer includes depositing an oxide.

13. The method of claim 1, wherein depositing the reflective layer includes depositing a reflective material from the group consisting of AlSiCu, WSi, POLY+WSi, and AlSiCu+ARC.

14. The method of claim 1, further comprising:

aligning the backside of the substrate, wherein the aligning is performed using the zero mark pattern on the front side of the substrate and uses a reflective from an incident laser.

15. A method of performing backside alignment of a wafer, the method comprising:

patterning a zero mark on a front side of a substrate;

depositing an etch stop layer over the patterned mark on the front side of the substrate;

depositing a reflective layer over the etch stop layer on the front side of the substrate;

flipping the wafer over with backside of the substrate facing up; and etching the substrate from the backside of the wafer, wherein the etching exposes the etch stop layer deposited on the front side of the substrate, wherein the etching includes:

exposing a backside pattern opposite to a zero mark of the front side using a photo clear-out mask; and using the backside pattern to etch the substrate from the backside to the etch stop layer over the front side of the substrate.

16. The method of claim 15, further comprising:

depositing a second hard mask layer over the backside of the substrate, wherein the etching the substrate from the backside includes etching through the hard mask layer.

17. The method of claim 16, wherein the etching through the hard mask layer uses an oxide etcher.

18. The method of claim 15, wherein the etching the substrate from the backside includes using a reactive ion etcher.

* * * * *